United States Patent [19]
Lin

[11] Patent Number: 5,422,838
[45] Date of Patent: Jun. 6, 1995

[54] CONTENT-ADDRESSABLE MEMORY WITH PROGRAMMABLE FIELD MASKING

[75] Inventor: Horng-Dar Lin, Holmdel, N.J.

[73] Assignee: AT&T Corp., Murray Hill, N.J.

[21] Appl. No.: 142,625

[22] Filed: Oct. 25, 1993

[51] Int. Cl.$^6$ .............................................. G11C 15/00
[52] U.S. Cl. ................................ 365/49; 365/189.02; 365/190
[58] Field of Search ..................... 365/49, 189.02, 190, 365/230.02

[56] References Cited

U.S. PATENT DOCUMENTS

| | | | |
|---|---|---|---|
| 4,296,475 | 10/1981 | Nederlof et al. | 365/49 X |
| 4,858,180 | 8/1989 | Murdoch | 365/49 |
| 5,239,642 | 8/1993 | Gutierrez et al. | 365/49 X |
| 5,257,220 | 10/1993 | Shin et al. | 365/49 |
| 5,258,946 | 11/1993 | Graf | 365/49 |

OTHER PUBLICATIONS

S. Ramirez-Chavez, "Encoding Don't Cares in Static and Dynamic Content-Addressable Memories," IEEE Transactions on Circuits and Systems, vol. 39, No. 8, pp. 575–578, Aug. 1992.

*Primary Examiner*—Do Hyun Yoo

[57] ABSTRACT

An apparatus and method for programmable field masking in content-addressable memory (CAM). The present invention provides a CAM with at least one group of memory cells interconnected by a word line and a match line. The group of memory cells includes data memory cells divided into a number of data memory cell fields for storing data bits of a data word. A mask memory cell is provided within the group of memory cells for storing at least one mask bit indicating a status of data stored in at least one of the data memory cell fields. The mask memory cell is operative to interrupt the match line in response to the stored mask bit. A match line detector detects a signal level on the match line to indicate if input data bits supplied on the data memory cell bit lines match data bits stored in at least one of the data fields. The data memory cell fields may be organized into a hierarchy, with mask memory cells connected between the data fields, to provide hierarchical masking. General programmable masking of any data field within the group is provided using multiplexed mask memory cells connected by bypass lines. The multiplexed mask memory cells may store one or more mask bits in order to allow a bypass line to be connected to portions of the match line, thereby masking a given data memory cell field.

36 Claims, 5 Drawing Sheets

CONTENT-ADDRESSABLE MEMORY WITH PROGRAMMABLE FIELD MASKING

BACKGROUND OF THE INVENTION

1. Field of the Invention

The present invention relates generally to improvements in information storage, retrieval and processing. More particularly, the present invention relates to improvements in content-addressable memory (CAM) used to process data packets or other information in a digital telecommunication system.

2. Description of Prior Art

A content-addressable memory (CAM) is a digital electronic memory circuit capable of storing quantities of digital data which can be simultaneously addressed or searched in response to an input data word. A CAM typically includes an array of memory cells, each memory cell storing a single data bit. The array of cells is usually organized into a number of rows and columns, with each row representing a group of stored data bits, or data words, and each column including individual stored data bits at a particular position in each data word. A CAM may output the actual data values stored in its memory cells when addressed by an input word. In its memory cell organization and data storage aspects, a CAM is thus similar to a random access memory (RAM). However, unlike a RAM, the CAM may also output a match signal indicating whether or not a given input word matches any of the data words stored in the entire CAM cell array. The CAM can thus provide parallel searching of the stored data words in each row of the array. This parallel searching function facilitates data storage and retrieval in a variety of different applications.

One important application of CAM is data packet processing in a broadband integrated services digital network (BISDN) operating in asynchronous transfer mode (ATM). BISDN is presently being developed to provide a high-capacity wide-area digital network suitable for multimedia communication. The variable high-speed data requirements of BISDN are efficiently handled using flexible packet processing techniques such as those provided by an ATM communication system. Such a system dynamically allocates data packet time slots to various users to obtain maximum network capacity for variable data traffic, rather than assigning fixed time slots to accommodate peak user data traffic as in synchronous transfer mode (STM) communication. The dynamic allocation of available bandwidth is accomplished, in part, by including a header in each data packet which identifies the packet by content rather than by a fixed time slot. The information in the header is checked against a look-up table to determine the appropriate processing steps for its corresponding packet. Portions of the look-up table may be implemented as a CAM to facilitate retrieval of stored packet processing information.

A significant problem with existing CAM systems is the effect of data fields which are not needed in a particular processing operation, commonly referred to as "don't care" data. In general, the don't care data stored in a CAM will slow down the process of matching an input word with the stored data words. In one currently used approach, the CAM includes a capability for masking particular columns of data bits within the CAM by setting a CAM mask register. However, this approach often uses an external pre-processing RAM to determine, for example, if a particular input packet header to be processed includes don't care values, as well as the bit positions of the don't care values. Additional hardware and processing steps are therefore usually required to provide such a data bit masking function within the CAM.

Another currently used technique for handling don't care data within a CAM is multi-step searching of the data words stored in the CAM. For example, if one or more fields of data bits may contain don't care values in a given application, the CAM may first be searched with one field of data bits masked off using a data bit masking capability and a CAM mask register, and then if no match is found, additional searches may be performed with other possible don't care fields masked off. Although this approach avoids the use of an additional external pre-processing RAM to determine which field of bits should be masked, the number of CAM searches which must be performed to check for matches for a given CAM input word is increased by a factor of $2^j-1$ for matching an input word divided into j fields, each of which may or may not contain don't care values.

An alternative to masking of don't care data fields in a CAM is to actually encode and store don't care bits as such. This approach is known as ternary encoding, and involves encoding three possible data states, logic 1, logic 0, and don't care, within the stored data words. Two data bits are therefore required to store each of these three data states. See S. Ramirez-Chavez, "Encoding Don't Cares in Static and Dynamic Content-Addressable Memories" IEEE Transactions on Circuits and Systems, Vol. 39, No. 8, August 1992. Although this storage technique may result in a decrease in the number of memory cells required to store, for example, intervals of sequential integers, ternary encoding will approximately double the required memory storage capacity in many conventional CAM applications. The larger required memory size results in increased system cost, increased vulnerability to failure, and larger processing overhead. Ternary encoding is therefore generally not considered a suitable technique for implementing telecommunication systems such as BISDN.

As is apparent from the above, a need exists for an improved CAM which is capable of efficiently masking fields of don't care data bits without using a pre-processing RAM, without additional searching steps or without unduly increasing the required CAM memory capacity.

SUMMARY OF THE INVENTION

The present invention provides programmable data field masking particularly well-suited for use in a content-addressable memory (CAM). A CAM in accordance with the present invention includes at least one group of memory cells interconnected by a word line and a match line, with each memory cell having a bit line for supplying an input bit to the cell; a number of data memory cells within the group of memory cells, divided into data memory cell fields for storing bits of a data word; a mask memory cell within the group of cells and connected between two of the data memory cell fields, for storing at least one mask bit indicating the status of at least one of the data memory cell fields; and a match line detector for detecting a signal level on the match line to determine if input data bits supplied on the bit lines of the data memory cells match the data bits stored in the data memory cells of at least one of the data memory cell fields. The status provided may be a don't care status, indicating that the data contained in a particular data field is to be masked, or ignored, in subsequent processing. The CAM of the present invention may include a number of memory words, or groups of sequentially-arranged memory cells, for storing a desired number of data words.

In accordance with one aspect of the present invention, hierarchical field masking may be provided by dividing the data memory cells into a first and a second memory cell field. The mask memory cell may be connected between the first and second data memory cell fields. The mask memory cell indicates whether or not the bits of the data word stored in the first data memory cell field have a don't care status. Other data words stored within the CAM may be similarly divided into different numbers of data fields of various sizes.

In accordance with another aspect of the present invention, general programmable field masking is provided such that any of the data fields within a given CAM data word may be programmably masked regardless of whether or not the data fields are arranged in a don't care hierarchy. General programmable masking is particularly well-suited to applications in which the data fields are not readily arranged into a hierarchy.

As a feature of the present invention, a CAM may be programmed to provide data field masking without the need for a pre-processing RAM. Additional external hardware and processing steps are therefore no longer required to determine if a given data word includes data bits having a certain status, such as a don't care status. Overall system cost, efficiency and reliability is reduced as a result.

As another feature of the present invention, additional searching steps are not required to implement the programmable field masking. The given don't care data may be indicated and stored as such within the data word itself by including one or more additional mask bits within a given word. A single search of the CAM, with the appropriate mask bits stored therein in accordance with the present invention, will be sufficient to determine if an input word matches any of the stored words.

As an additional feature of the present invention, programmable field masking is provided without the need for a significant increase in CAM memory cell capacity. Instead of the two-fold increase in required capacity typically associated with ternary don't care encoding, only a small increase in CAM memory capacity is required to store, for example, a single mask bit to provide hierarchical two field masking of a given data word.

As a further feature of the present invention, a programmable field-masking capability will provide data packet processing advantages in BISDN systems using ATM communication, as well as data storage and retrieval improvements in a variety of other applications. The programmable field masking approach provided is highly flexible, and does not depend upon the characteristics of a given set of data words.

The above discussed features, as well as additional features and advantages of the present invention, will become more readily apparent by reference to the following detailed description and the accompanying drawings.

DETAILED DESCRIPTION

The present invention provides a programmable field masking apparatus and method which improves the efficiency of data storage and retrieval. Although the improvements provided by the present invention are illustrated herein primarily in the context of ATM data packet processing in a telecommunication system, it should be understood that similar improvements are provided in other CAM applications, including, for example, searching stored dictionaries or numerical data.

Figure 1:
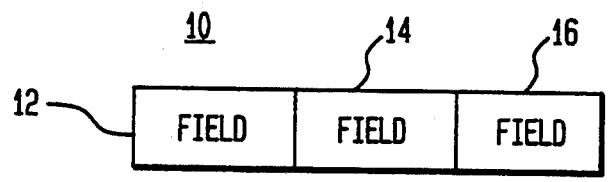
FIG. 1 illustrates an exemplary data word divided into several data fields.

FIG. 1 shows an exemplary data word 10. The data word 10 is divided into a first data field 12, a second data field 14, and a third data field 16. Each of the data fields 12, 14, 16 within the data word 10 includes a number of data bits. The particular arrangement of data words and division of data words into data fields may vary greatly depending upon the application in which the data word is used. For example, the data fields within data word 10 may include any number of data bits, and in certain applications a given data field may include only a single data bit. The data fields 12, 14, 16 may be organized into a data hierarchy such that if the data bits within data field 12 have a certain status, such as a don't care status, the data bits within data field 14 may or may not share that same don't care status. However, if the data bits within data field 14 or 16 are don't care values, then the data bits within all previous fields, such as field 12, must also be don't care values. Thus, the fields within data word 10 are organized into a hierarchy from right to left, with the right-most field, field 16, having the highest priority in the hierarchy. This means that if, for example, we ignore a given field of a word as containing don't care values, we also automatically ignore any lower priority fields within the word. Such a hierarchical arrangement of data fields is inherent in many data communication applications, such as a typical ATM telecommunication system.

Figure 2:
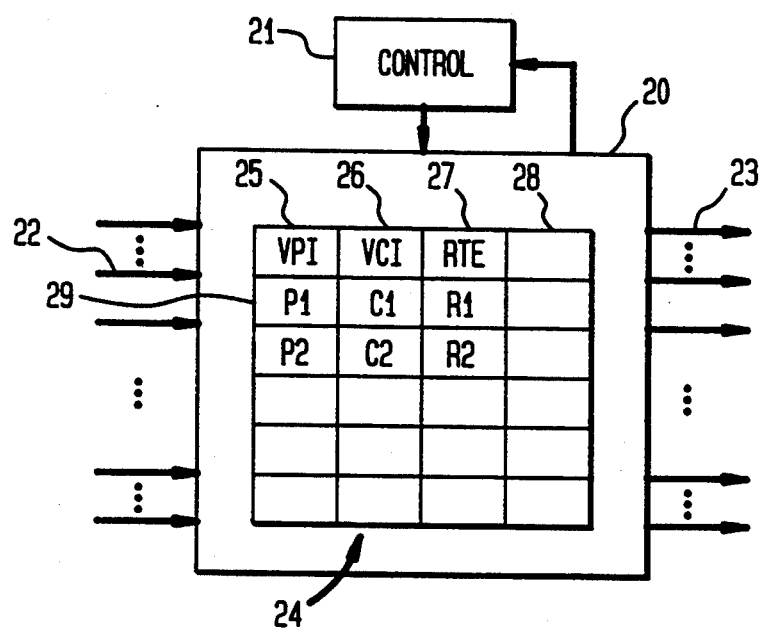
FIG. 2 is a block diagram of an exemplary packet switch incorporating a look-up table which may be implemented as a CAM.

In telecommunications systems, transmitted data packets typically include a header which identifies the packet. The data in the header may also be used to access a stored look-up table to determine subsequent processing steps required for that packet. FIG. 2 is a block diagram of an exemplary packet switch 20 which incorporates such a look-up table. The packet switch 20 is controlled by a packet switch controller 21 and supplies a plurality of packet inputs 22 to a plurality of packet outputs 23. The packet switch 20 also includes a look-up table 24 stored within memory which may be a CAM, RAM, or a combination of CAM and RAM. The look-up table 24 is shown qualitatively as a unconnected block within the packet switch 24, but it should be understood that a typical packet switch will also contain additional processing elements and interconnections not shown in FIG. 2. The exemplary look-up table 24 includes columns corresponding to various data fields in a typical ATM packet header. A first column 25 contains data corresponding to a packet virtual path indicator (VPI), and a second column 26 contains a packet virtual channel indicator (VCI). The VPI and VCI data are used to determine the subsequent packet routing. A third column 27 contains this routing (RTE) information, and a fourth column 28 contains any additional information needed to process the data packets within packet switch 20. In the ATM example shown, the VPI and VCI columns 25, 26 will typically be implemented as a CAM, while the third and fourth columns may be implemented in RAM.

The headers of packets applied to packet inputs 22 are matched against the VPI and VCI data fields stored within columns 25, 26 in the CAM. If a match is obtained, the match line of a particular row 29 will address the routing and other information within columns 27, 28 associated with that row. For example, if an incoming packet header contains data P1 and C1 in its VPI and VCI data fields, respectively, these fields will match with the CAM word in row 29. The match line of this CAM word will therefore address the corresponding row in the RAM, yielding routing information R1. The routing information R1 may indicate that the packet switch 20 is to output a data packet with data P1 and C1 in its respective VPI and VCI fields onto a particular packet output 23 identified as R1. The packet switch 20 thus processes information in the headers of input data packets in order to determine routing and other subsequent processing steps for the data packets. The arrangement of data rows and columns within look-up table 24 will, of course, vary depending upon the application. The exemplary look-up table 24 in FIG. 2 is simplified to illustrate the look-up mechanism, and in reality may be considerably more complex, containing additional information for replacing the packet headers, monitoring traffic flow in the network, and the like.

Figure 3:
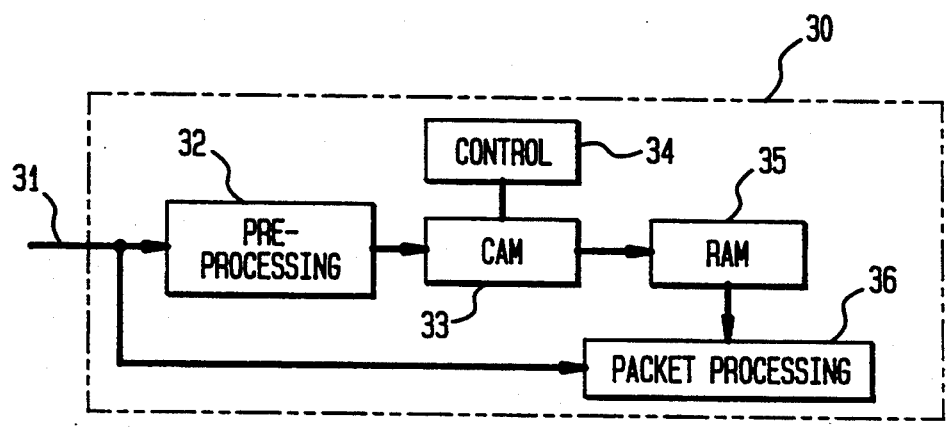
FIG. 3 is a block diagram of an exemplary data packet processing system which utilizes a CAM to process ATM data packet headers.

FIG. 3 is a block diagram of a more general implementation of a packet processing system 30 including a look-up table implemented with both CAM and RAM. The exemplary processing system 30 includes a data packet input 31 which drives a pre-processor 32. The pre-processor 32 separates the data packet header from the other information within the packet, or packet payload, and supplies the packet header to a CAM 33. Controller 34 regulates access of incoming packet headers to the CAM 33, where the headers are compared to stored data words. If a match with a particular data word stored in the CAM 33 is found, a match line associated with that word is triggered. The match line of each data word within the CAM 33 corresponds to a row of memory cells within RAM 35. When a match triggers a particular match line within the CAM 33, the match line addresses the RAM 35 to access the additional processing data for the input data packet. As described above, the processing data may be routing information and/or other types of information. The processing information is supplied to processor 36 where the remaining portion of the data packet, typically the packet payload, is processed in accordance with the data stored in RAM 35. The system 30 may therefore perform a function similar to that provided by packet switch 20 in FIG. 2, or may perform other types of processing. Since the CAM 33 may be searched in parallel for matches with an incoming packet header, the arrangement shown in FIG. 3 facilitates data packet processing by speeding up the search of memory in RAM 35. The system of FIG. 3 thus provides memory storage and retrieval advantages over a RAM-based packet processing system.

Figure 4:
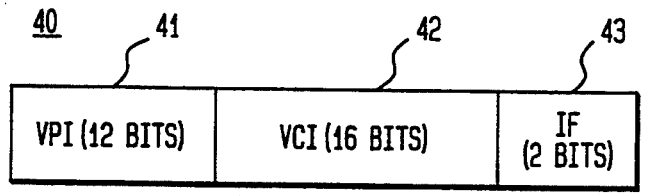
FIG. 4 illustrates an exemplary data word corresponding to a packet header in a typical ATM telecommunication system.

The data fields in a typical ATM packet header are shown in FIG. 4. An exemplary data word 40 includes a VPI data field 41, a VCI data field 42, and an IF data field 43. As mentioned above, the VPI and VCI data are used to identify subsequent processing steps for the packet. In an ATM system, several virtual channels may be combined together within a given virtual path, and therefore an ATM channel may be identified by its VPI alone or by both its VPI and VCI. For channels which are only VPI-based, the VCI data field in the packet header has a don't care status, and should be ignored, or masked, when matching is attempted in the CAM. In order to handle the possible don't care values, many existing techniques use multi-step matching. The CAM will first be searched with both the VPI and VCI fields, and if no match is found, then the CAM will be searched with the VCI field masked off in order to properly match a VPI-based channel. Since in this example the data word is divided into two fields, two searching steps are usually necessary using available techniques. The present invention avoids these additional processing steps by storing one or more mask bits within mask memory cells in each memory word in the CAM.

Figure 5:
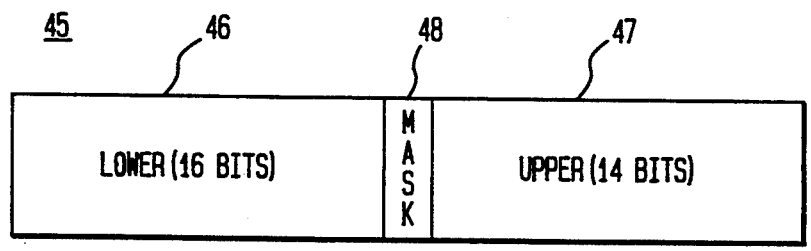
FIG. 5 illustrates an embodiment of a data word in accordance with the present invention using the packet header of FIG. 4 with a single mask bit between two fields of data bits.

FIG. 5 is an exemplary data word which provides hierarchical field masking in accordance with the present invention. The data word 45 includes a lower data field 46, an upper data field 47, and a mask bit 48 separating the two fields 46, 47. The mask bit 48 indicates the status of the bits within the first data field 46. For example, if the data field 46 contained data which had a don't care status in a given application, the mask bit 48 is set such that the data bits within data field 46 are ignored in CAM matching. If the mask bit 48 is set to a logic 1 value, the data bits within the lower data field 46 are used in the CAM matching process. However, if the mask bit is set to a logic 0 value, the data bits within the lower data field 46 are ignored as don't care values. In either case the data bits within the upper data field 47 are used regardless of the status of the mask bit 48. As used herein, a logic 0 level is generally a low voltage level which will be sufficient to turn an NMOS transistor off, or place the transistor in a nonconductive state, when present at the transistor gate. A logic 1 level is generally a high voltage level sufficient to turn an NMOS transistor on, or place it in a conductive state, when present at its gate. It will be understood by those skilled in the art that the logic levels associated herein with a given function may be reversed or otherwise altered in various alternative embodiments of the present invention.

The exemplary data word 45 includes data fields which correspond to those shown in FIG. 4. In an ATM application, the size of the first data field 46 of data word 45 may be chosen to include sixteen data bits. These sixteen bits correspond to the VCI field 42 of the exemplary ATM data word 40 shown in FIG. 4. The second data field 47 of data word 45 may include fourteen data bits to store the VPI data field 41 and the IF data field 43 of ATM data word 40. In this exemplary embodiment, the mask bit 48 is located between first field 46 and second field 47. The lower field 46 thus includes VCI data which may or may not be don't care data in a given packet. Mask bit 48 is set to a particular value in a given packet header to indicate that the VCI in lower data field 46 is don't care data for that header. Since most ATM data packets will include at least a VPI indicator, it will generally not be necessary in such an application to mask the data bits in second data field 47. The ATM header data thus has an inherent hierarchy, with the VPI data having a higher priority than the VCI data. Although the arrangement shown in FIG. 5 is particularly well-suited for use in ATM communication, alternative applications may utilize a different data field hierarchy. General masking, as opposed to hierarchical masking, which provides the capability of masking either the first or second data fields 46, 47, will be discussed in greater detail below.

Figure 6:
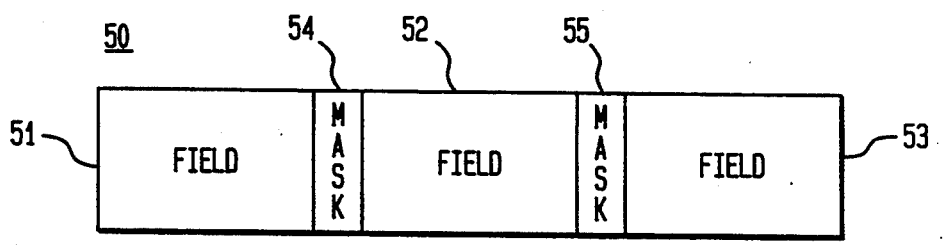
FIG. 6 illustrates another embodiment of a data word in accordance with the present invention with three fields of data bits separated by mask bits.

FIG. 6 illustrates an embodiment of a data word providing hierarchical field masking of three data fields in accordance with the present invention. The data word 50 includes a first data field 51, a second data field 52, and a third data field 53. In this exemplary arrangement, a first mask bit 54 is located between first data field 51 and second data field 52. A second mask bit 55 is located between second data field 52 and third data field 53. The data fields 51, 52, 53 are arranged in a hierarchy such that the don't care status of the fields 51, 52 are indicated by the values of the mask bits 54, 55. For example, if first mask bit 54 is a logic 0 value, it would indicate that the data within data field 51 has a don't care status. Similarly, if the second mask bit 55 has a value which is a logic 0, it would indicate that the data fields 51 and 52 are both don't care values to be ignored in CAM matching. If both first and second mask bits 54, 55 have logic 1 values, it would indicate that all three data fields of the data word 50 are to be used in CAM matching. The hierarchical field masking described above may be readily extended to data words including any number of data fields, with any number of data bits within each field.

Figure 7:
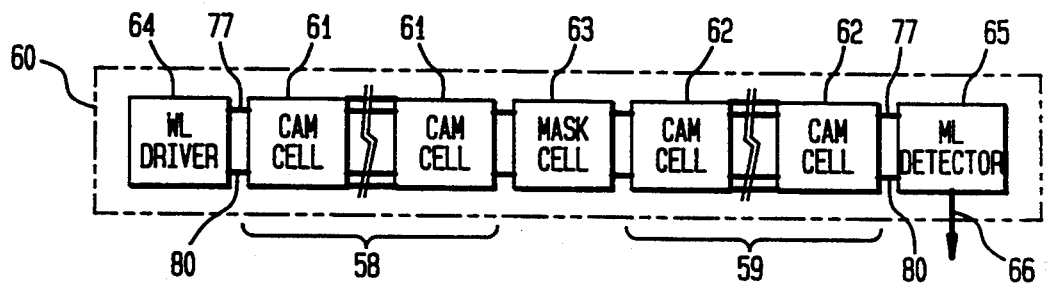
FIG. 7 is a block diagram of an exemplary memory word within a CAM in accordance with the present invention.

FIG. 7 illustrates an exemplary CAM memory word for use with the data word arrangement shown in FIG. 5. The arrangement shown is particularly useful for two field masking when the priority of the second field is greater than that of the first field. Only a single memory word in the CAM is shown. It should be understood, however, that a typical CAM will include a relatively large number of memory words similar to that shown in FIG. 7. The memory words within the CAM will typically be arranged vertically as rows of an array, with each row interconnected via bit lines extending through the CAM memory cells of each memory word. The term "memory word" is used herein to refer to the hardware within the CAM used to store a data word. A CAM memory word in accordance with the present invention may therefore include not only a group of data and mask memory cells, but also other supporting circuitry, such as, for example, a match line detector and a word line driver.

In the exemplary memory word 60 shown in FIG. 7, a first data field 58 includes a plurality of CAM data memory cells 61. Similarly, a second data field 59 includes a plurality of data memory cells 62. The first and second data fields 58, 59 are separated by a mask memory cell 63. The mask memory cell 63 provides the masking function described above. A data word may be stored in a given row of memory cells by placing a write signal on the word line which interconnects the row of cells, and the desired data bit on the bit line interconnecting a column of cells. The write signal activates an individual memory cell to accept and store the data bit value present on its corresponding bit line. A word line driver 64 supplies a write signal which enables the storage of values on the bit lines of a memory cell. During matching, an input data word supplied on the bit lines is compared to the data word stored within the CAM word line. The CAM cells 61, 62 store the data word for the single exemplary memory word shown. If an input data word matches the data word stored in the CAM data memory cells, a match signal, which may be, for example, a current or voltage level, is detected in match line detector 65 and supplied to match detector output 66. The match detector output 66 may be used to drive a RAM to access additional packet processing information. Alternatively, the match detector output 66 could be used to set an address value in a set of programmable address elements. Each address element is pre-encoded to be triggered into a high or low state in response to a match signal level, with each set of triggered elements representing a unique address which may be used in subsequent processing. A match signal on match detector output 66 could also be utilized for a variety of other purposes, as appropriate in a given application.

Both the first and second data fields 58, 59 in FIG. 7 are shown containing multiple data memory cells. However, as mentioned above, in certain applications a particular data field may contain only one data memory cell. Although the exemplary data memory cells discussed herein generally store a single data bit, alternative cells could store more than one bit. The memory cells within first and second data fields 58, 59 are referred to herein as data memory cells because they typically contain header data bits rather than mask bits. Although the mask bits stored within mask memory cell 63 may also be characterized as data, the cell 63 is referred to herein as a mask memory cell, indicating that the bit contained therein performs a masking function. The mask bit stored within mask memory cell 63 indicates the status of the data bits within first data field 58. For example, if mask cell 63 contains a logic 1 value, the data within data field 58 is used in CAM matching operations. However, if mask memory cell 63 contains a logic 0 value, this indicates that data field 58 has a don't care status, and that the bits contained therein are to be ignored, or masked, in subsequent CAM matching. Memory word embodiments capable of storing the exemplary three-field data word of FIG. 6, as well as other alternative embodiments, could also be used.

Figure 8:
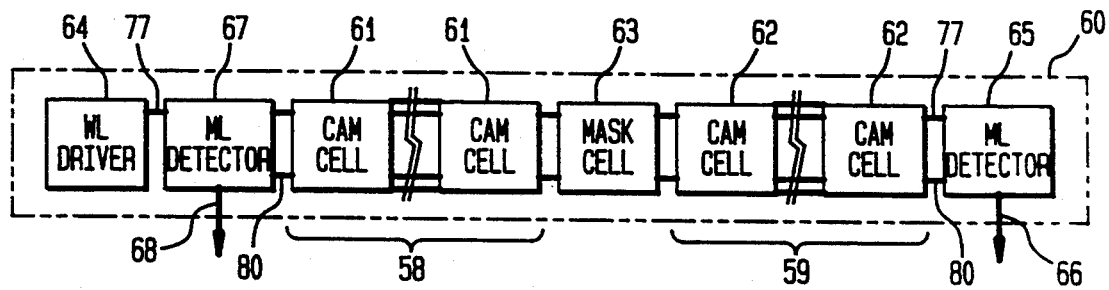
FIG. 8 is a block diagram of an exemplary memory word including dual match line detectors in accordance with the present invention.

FIG. 8 shows an alternative embodiment of a CAM memory word 60 in accordance with the present invention. In this embodiment two match line detectors 65, 67 are used to provide general two-field masking. The CAM memory word 60 is again divided into first and second data fields 58, 59. A single mask memory cell 63 is located between first and second data fields 58, 59. A first match line detector 65 is located at a right-most end of the memory word 60. A second match line detector 67 is located at a word line driver end of the memory word 60. In this embodiment, either first data field 58 or second data field 59 may be programmably masked. The match line may be interrupted within mask memory cell 63 as will be described in greater detail below, and therefore each field 58, 59 may be independently matched using a right or left portion of the match line on either side of mask cell 63. Matching with the first field masked is performed by using the first match line detector 65, while matching with the second field masked is performed by using the second match line detector 67. Additional match line detectors may be included within the memory word to provide field masking of three or more data fields.

Figure 9B:
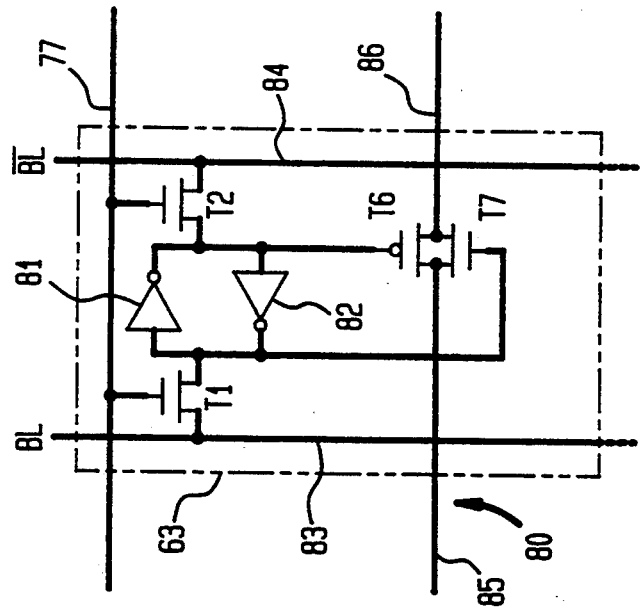
FIG. 9(b) is a schematic diagram of an exemplary CAM mask memory cell in accordance with the present invention.
Figure 9A:
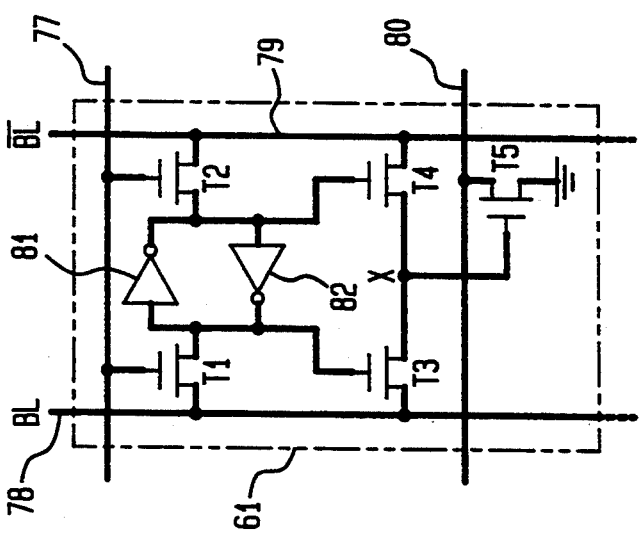
FIG. 9(a) is a schematic diagram of an exemplary CAM data memory cell in accordance with the present invention.

FIG. 9(a) shows an exemplary CAM data memory cell 61. Although the data memory cell is designated by reference number 61, it should be understood that the same memory cell could also be used as a memory cell 62 in second data field 59. A word line 77, a bit line 78, and a bit line complement 79 pass through the data memory cell 61. A match line 80, which indicates for the entire CAM memory word whether a particular input data word matches the data stored in the memory word, also passes through data memory cell 61. The word line 77 and match line 80 extend through and interconnect the memory cells of an entire CAM memory word, while bit lines 78, 79 extend through all the memory cells in corresponding bit positions in the other CAM memory words. As noted above, a memory word includes a group of memory cells which store a data word and any associated mask bits. The memory word is typically a sequentially-arranged group of memory cells interconnected by a match line and a word line, and a CAM generally includes a large number of memory words interconnected by bit lines.

In the exemplary data memory cell 61 of FIG. 9(a), a single data bit is stored using the storage elements T1, T2, 81 and 82. The transistors T1 and T2 are typically NMOS field effect transistors (FETs), although other types of transistors could also be used. The gates of transistors T1 and T2 are connected to word line 77. The drain of transistor T1 is connected to bit line 78. The source of transistor T2 is connected to bit line complement 79. CMOS inverters 81, 82 are arranged in parallel and in opposite orientations between the source of transistor T1 and the drain of transistor T2. Transistors T1 and T2, along with inverters 81, 82 perform a memory storage function similar to that of a memory cell in a RAM. Other memory storage elements could also be used in place of T1, T2, 81 and 82. It should be noted that the particular designation herein of MOS transistor terminals as source or drain is for illustration purposes only. For example, it will be understood by those skilled in the art that the designated sources and drains of the MOS transistors shown may be readily reversed in a manner well known in the art to provide additional alternative embodiments of the exemplary CAM memory cells.

The memory storage operation in exemplary memory cell 61 is as follows. When a write signal applied to word line 77 is at a logic 1 level, transistors T1 and T2 are turned on, supplying a data bit and its complement present on bit line 78 and bit line complement 79, respectively, to inverters 81, 82. The parallel arrangement of inverters 81, 82 permits the data bit to be stored within cell 61. The inverters 81, 82 are arranged such that a data bit supplied to these inverters when a write signal on word line 77 is a logic 1 will be sustained within invertors 81, 82 even after the signal on word line 77 returns to a logic 0. The write signal applied to word line 77 therefore controls the data which is written into memory cell 61 in accordance with the values present on bit line 78 and bit line complement 79. Once a data bit is stored within memory cell 61, the bit line 78 and bit line complement 79 are no longer used to supply data to the memory cell 61. Regardless of subsequent bit values on bit line 78 and bit line complement 79, the bit value present on these lines when word line 77 was last at a logic 1 value determines the data content of the memory cell 61. Typically, the word line 77 is maintained at a logic 0 value during a match operation. Bit line 78 and bit line complement 79 are then used to supply a data bit of an input data word to be checked for a match with the data bit stored in memory cell 61. NMOS transistors T3, T4 and T5 are used to implement this matching function. Although these transistors are shown as NMOS, other types of transistors, including PMOS, may also be used in alternative embodiments.

In the exemplary data memory cell 61, transistor T5 sets the signal level on match line 80. Transistor T5 may be in one of two states. When the point X, at the gate of T5, is low, T5 is off and match line 80 is floating. When X is high, match line 80 is pulled to ground, or a logic 0 value, via T5. The bit stored in memory cell 61 will be present in uncomplemented form on the gate of T3, and in complemented form on the gate of T4. If a logic 1 is stored in cell 61, T3 is turned on, placing the current data bit on bit line 78 at the gate of transistor of T5. If the current value of bit line 78 is also a logic 1, T5 will turn on and pull the match line 80 to ground. If a logic 0 is stored in cell 61, T3 is turned off. The gate of T4 is supplied with a logic 1 from inverter 81 and T4 will therefore be turned on, placing the current value of complementary bit line 79 at the gate of T5. If the value present on bit line complement 79 is a logic 0, a match has occurred and the gate of T5 is at a low value such that match line 80 will float. In the exemplary cell 61, therefore, a match results if the bit line 78 has a value which is the complement of the stored bit, and the bit line complement 79 has a value which is the same as the stored bit. The sequential arrangement of data memory cells 61 within first data field 58 will therefore provide a NOR function. The match line 80 is pulled low unless a match occurs in all of the cells 61, in which case the match line floats. The match line detector 65 detects a change in the match line 80 signal level to indicate whether or not a match has occurred. As noted above, the match line signal level detected may be a current or a voltage level.

FIG. 9(b) is a schematic of an exemplary mask memory cell 63 in accordance with the present invention, suitable for use with the data memory cell 61 of FIG. 9(a). The mask memory cell 63 also includes transistors T1, T2 and inverters 81, 82 which operate as described above to store a mask bit within mask memory cell 63. Word line 77 and match line 80 pass through mask memory cell 63 as shown. A bit line 83 and bit line complement 84 pass vertically through cell 63 and supply a mask bit which is written into cell 63 in a manner previously described. The match line 80 passing through mask memory cell 63 is divided into a left portion 85, and a right portion 86. The left portion 85 of match line 80 extends through the data memory cells 61 to the left of the mask cell 63. The right portion 86 of match line 80 extends through the data memory cells 62 to the right of mask cell 63. The data cells 61, 62 may be as shown in FIG. 9(a) when the mask cell 63 shown in FIG. 9(b) is used.

Transistors T6 and T7 serve as a switch in series with the match line 80 within cell 63 to effectively interrupt the match line passing through the data memory cells on either side of mask cell 63 in accordance with a stored mask bit. In this embodiment, transistor T6 is a PMOS device, while transistor T7 is an NMOS device. The transistors T6 and T7 are therefore MOS transistors of opposite channel type. When a logic 1 is stored in mask memory cell 63, the gate of T6 is low and T6 is therefore on. The drain and source of T6 are connected in series with the match line 80 and in parallel with the drain and source of T7. At the same time, a logic 1 is present at the gate of T7, and T7 is therefore on. Thus, the left portion 85 of match line 80 is connected to the right portion 86 of the match line 80 through the drain and source of transistors T6 and T7 such that match line 80 is uninterrupted in passing through mask memory cell 63 and data memory cells 61, 62 of the exemplary CAM word shown.

However, when a logic 0 mask bit is stored in the mask memory cell 63, the gate of T6 is high, and the gate of T7 is low, turning T6 and T7 off. The left portion 85 of match line 80 is thereby disconnected from the right portion 86 such that transistor T5 in each of the data memory cells 61 to the left of mask cell 63 is disconnected from the portion of the match line 80 which passes through data memory cells 62 to match line detector 65. Therefore, the data bits stored in data memory cells 61 are masked, or treated as don't care values, during matching. The mask bit stored in cell 63 thus determines the don't care status of the first data field 58. In alternative embodiments of the cell 63, a single transistor, such as either of the transistors T6 and T7 alone, could be used in place of the parallel combination shown to effect an interruption of match line 80. The arrangement shown in FIG. 7 may be extended to larger numbers of data memory cell fields by separating the additional data fields by mask cells. In the embodiment shown, the word line driver 64 is typically adjacent a left-most data field while match line detector 65 is adjacent a right-most data field.

Figure 10A:
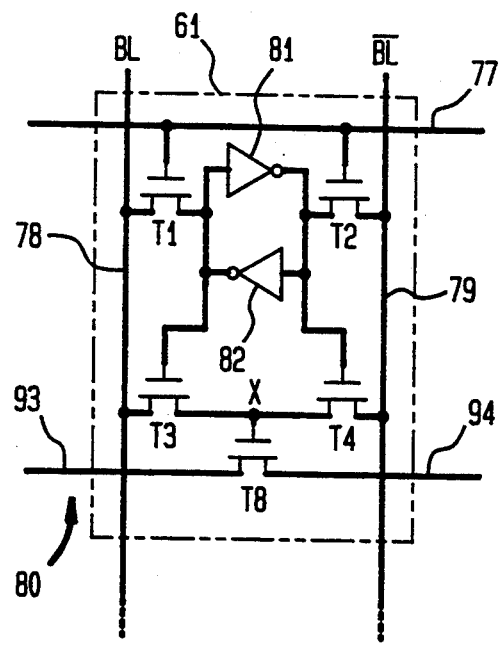
FIG. 10(a) is a schematic diagram of another exemplary CAM data memory cell in accordance with the present invention.

Another exemplary CAM data memory cell 61 is shown in FIG. 10(a). Again, the same data memory cell may be used for memory cell 62. Word line 77 passes through data memory cell 61, and other data and mask memory cells 61, 62, 63 in the CAM memory word 60. Word line 77 enables data storage in the memory cells as previously described. Transistors T3 and T4 provide a signal level at point X, the gate of transistor T8, during matching. It should again be noted that during matching operations in a CAM, word line 77 will generally be disabled, or held at a logic low level in this case. If we assume a logic 0 is stored in data memory cell 61, this stored logic 0 is present at the gate of T3 and T3 is therefore off. A logic 1 is present on the gate of T4 and therefore T4 is turned on. If, during a matching operation, a logic 0 is applied to bit line 78, and a logic 1 is applied to bit line complement 79, the logic 1 on the bit line complement 79 is supplied via T4 to the gate of T8. T8 is thereby turned on and a left portion 93 and a right portion 94 of match line 80 passing through cell 61 are connected. This corresponds to a match between the bit lines and the bit value stored in the data memory cell.

If a logic 1 is stored within data memory cell 61, a logic 1 will be present on the gate of T3, thereby turning T3 on and connecting bit line 78 to the gate of T8. Similarly, a logic level 0 is present at the gate of T4, thereby turning T4 off and preventing signals from passing from bit line complement 79 to the gate of T8. If a signal on bit line 78 is a logic 1, corresponding to a match with the data bit stored in cell 61, the gate of T8 will be high, connecting left portion 93 and right portion 94 of match line 80 in cell 61. If a logic 0 is present on bit line 78, corresponding to a non-match between the bit line and the stored data bit, the gate of T8 will be low, thereby turning T8 off and interrupting signal flow between left portion 93 and right portion 94 of match line 80.

The match line 80 passing through the memory word 60 will be uninterrupted only if transistor T8 in each data memory cell in memory word 60 is on. The memory cell 61 shown in FIG. 10(a) is referred to as a NAND-type memory cell because a plurality of adjacent data memory cells provide a NAND function. Thus the match line will be triggered, indicating a match between an input data word and the data word stored in the CAM memory word 60, only when all of the series transistors T8 are in an on state. A single T8 in an off state will disrupt the match line 80 and provide a floating match line signal, which corresponds to a non-match with the stored data word.

Figure 10B:
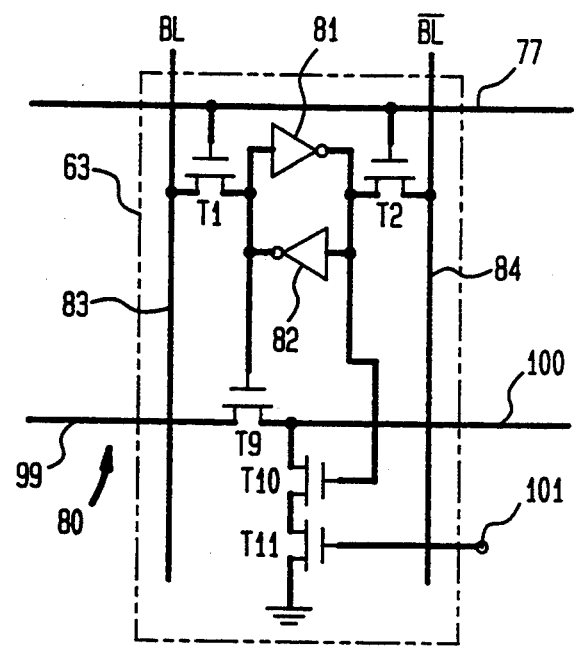
FIG. 10(b) is a schematic diagram of another exemplary CAM mask memory cell in accordance with the present invention.

FIG. 10(b) is a schematic of another exemplary mask memory cell 63 in accordance with the present invention, suitable for use with the data memory cell 61 of FIG. 10(a). Word line 77 passes through mask memory cell 63 and connects the cell to the respective data memory cells 61, 62 in first and second data fields 58, 59. The storage function provided by transistors T1, T2 and inverters 81, 82 was described previously. Bit line 83 and bit line complement 84 are used to write a mask bit to the mask memory cell 63. The match line 80 passing through the mask memory cell 63 includes a left portion 99 and a right portion 100. The left portion 99 of match line 80 is connected to the right portion 94 of match line 80 in a right-most data memory cell 61 of adjacent first data field 58. The right portion 100 of match line 80 is connected to the left portion 93 of match line 80 passing through a left-most data memory cell 62 of adjacent second data field 59. Transistor T9 has a drain connected to left portion 99 of match line 80 and a source connected to right portion 100. The gate of T9 is connected to the stored memory bit at the source of T1. T9 is therefore in an on or an off state depending upon the mask bit stored in mask memory cell 63. It should be recognized that a parallel transistor of opposite channel type, with its gate connected to a memory storage element storing the complement of the mask bit, may also be included in the embodiment of FIG. 10(b). This parallel transistor could be connected in parallel with, for example, transistor T9, in a manner similar to the connection of T6 and T7 in FIG. 9(b).

The complement of the stored mask bit is present at the drain of T2 and also at the gate of T10. When the stored mask bit is at a logic 1, T9 is in an on state. The match line left and right portions 99, 100 will therefore be connected through T9, providing a logic 1 signal level on match line 80, assuming the match line is pre-charged to a logic 1 level prior to the matching operation. Both the first and second data fields 58, 59 are then used in matching. When a logic 0 is stored in mask memory cell 63, T9 has a logic 0 at its gate and is therefore in an off state. T10 has a logic 1 at its gate and is therefore in an on state, allowing a connection of match line right portion 100 to ground potential through the drain and the source of T10. The source of T10 may be connected directly to ground potential.

An additional transistor T11 may be included between the source of T10 and ground potential in order to protect T10 from excessive current which may pass through it to ground potential during match line pre-charge. The input 101 to the gate of T11 may be tied to a logic low level during pre-charging of the left and/or right portions 99, 100 of the match line 80 in order to prevent excessive current flow through T10. During normal matching operation, the gate input 101 of T11 is tied to a logic high level to connect the source of T10 to ground potential through the drain and source of T11. Other means may be used to protect T10 from excessive current during pre-charge. For example, the point X at the gate of transistor T8 in one or more data memory cells 61, 62 may be forced to a logic 0 value in order to insure that all T8 transistors in the match line 80 are not simultaneously turned on to create excessive current flow through T10 during pre-charge.

Figure 10C:
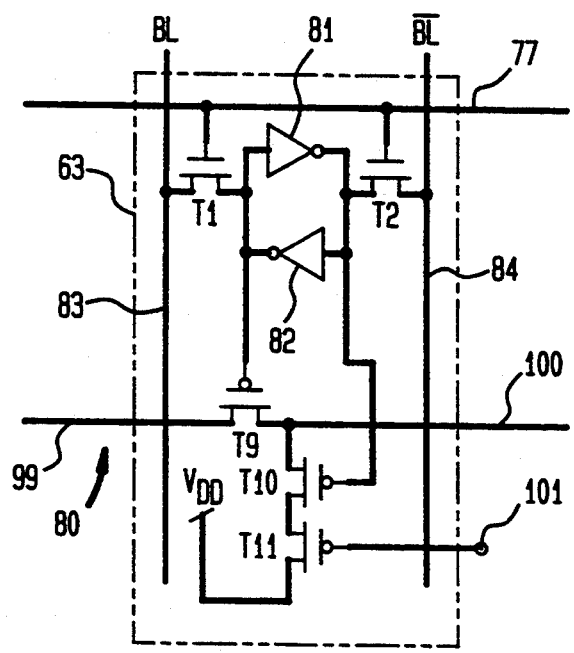
FIG. 10(c) is a schematic diagram of another exemplary CAM mask memory cell in accordance with the present invention.

Although the circuit implementation of FIG. 10(b) preferably uses NMOS transistors, it should be understood that other types of transistors may also be used. For example, an implementation of the mask cell 63 using PMOS transistors is shown in FIG. 10(c). The operation of this device is similar to that of the NMOS mask cell, of FIG. 10(b) except that a stored logic 1 mask bit will permit field masking, rather than a logic 0 mask bit as in the cell of FIG. 10(b). Since T9 and T10 in FIG. 10(c) are PMOS devices, they will be placed in an on state by a logic 0 at their respective gates. A stored logic 0 mask bit will allow T9 to turn on and T10 to turn off, thereby providing an uninterrupted match line. A stored logic 1 mask bit will turn T9 off and T10 on to mask data bits to the left of the mask memory cell 63. In addition, when using a PMOS device for T10, the drain and source interconnections are reversed, and the drain of T10 is connected through T11 to a positive voltage potential $V_{DD}$ rather than ground potential. The logic levels applied to the gate input 101 of T11 are similarly reversed in the PMOS mask cell.

Figure 11:
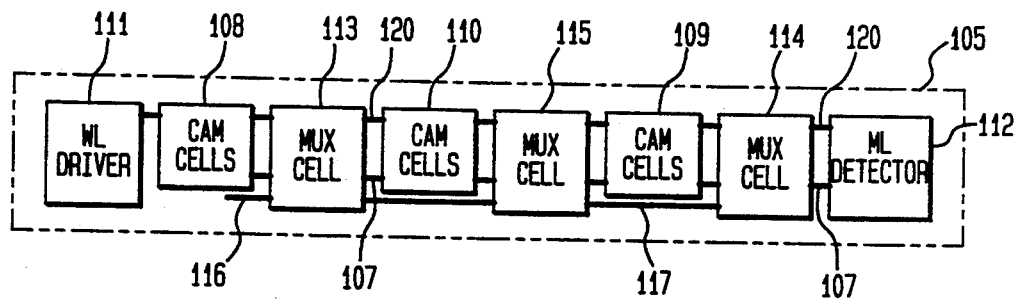
FIG. 11 is a block diagram of another embodiment of a memory word utilizing multiplexed mask memory cells in accordance with the present invention.

Another embodiment of a CAM memory word in accordance with the present invention is shown in FIG. 11. Exemplary memory word 105 includes a sequentially arranged group of memory cells, with data memory cells divided into data memory cell fields 108, 109, and 110. A match line 107 passes through and interconnects all of the memory cells in the memory word 105, from the left-most data memory cell in the first data field 108 to the match line detector after the right-most mask memory cell. The memory word 105 includes a word line driver 111, at one end of the memory word 105, and a match line detector 112 at an opposite end of the word 105. The data memory cell fields 108, 109, 110 are separated by multiplexed mask cells 113, 114, 115. The first multiplexed mask cell 113 is capable of storing two mask bits, a left mask bit and a right mask bit. The first multiplexed cell 113 is located between the first field of data cells 108 and a third field of data cells 110. The second multiplexed mask cell 114 is located between the second group of data memory cells 109 and the match line detector 112. The third multiplexed mask cell 115 is located between the third field of data memory cells 110 and the second field of data memory cells 109.

This exemplary arrangement allows any of the data memory cell fields 108, 109, 110 to be programmably masked in accordance with mask memory bits stored in multiplexed mask cells 113, 114, 115. Thus, the data stored in the data memory cell fields need not be arranged in a hierarchy of priority to provide masking. Any of the data fields may be programmably masked independent of the status of the other data fields of memory word 105. In the exemplary embodiment of FIG. 11, the status of the respective data memory cell fields within CAM word 105 is determined by two mask bits stored in multiplexed mask cells 113, 115 and a single mask bit stored in multiplexed mask cell 114.

Figure 12A:
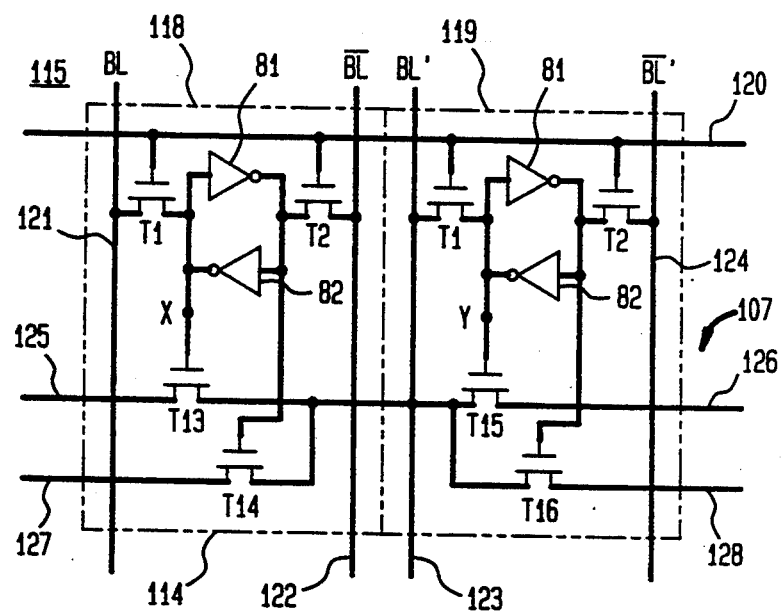
FIG. 12(a) is a schematic diagram of an exemplary multiplexed mask memory cell suitable for use in the CAM word of FIG. 11.

An exemplary multiplexed mask memory cell 115 is shown in FIG. 12(a). The multiplexed mask memory cell 115 includes a left mask cell 118 and a right mask cell 119. A word line 120 passes through the multiplexed mask cell 115 as well as through the other data memory cells and multiplexed mask cells within the memory word 105. The left mask cell 118 includes a bit line 121 and a bit line complement 122. The right mask cell 119 of the multiplexed mask cell 115 includes a bit line 123 and a bit line complement 124. The bit lines 121, 123 and bit line complements 122, 124 provide mask bits to the multiplexed mask memory cell 115. Again, the mask bits are written into the mask cells by supplying the bits to the appropriate bit lines while raising word line 120 to a logic high level. Transistors T1 and T2 and inverters 81, 82, provide the memory storage function, as previously described. The stored mask bit in the left mask cell 118 in multiplexed cell 115 is present at point X, and the gate of T13. The complement of the stored bit is supplied to the gate of T14. Similarly, a stored mask bit is present at the point Y in the right mask memory cell 119, and at the gate of T15 with the complement of the stored bit at the gate of T16.

The left portion 125 of match line 107 is connected to the drain of T13 within the left mask memory cell 118 of the multiplexed cell 115 and to the right-most data memory cell within third data memory cell field 110. Similarly, the right portion 126 of the match line 107 passing through multiplexed cell 115 is connected to the left-most data memory cell within data field 109. The match line 107 with match line left portion 125 and match line right portion 126 provides a match line function similar to that described above in conjunction with FIGS. 9 and 10. A bypass line is included in both the left mask memory cell 118 and the right mask memory cell 119. The bypass lines 127, 128 do not pass through the data memory cell fields 108, 109, 110, but are instead used to interconnect the multiplexed mask memory cells 113, 114, 115. The left mask memory cell 118 includes match line left portion 125 and a left bypass line 127. The right mask memory cell 119 includes match line right portion 126 and a right bypass line 128. The bypass lines 127, 128 are used to bypass, or mask, a particular data memory cell field located between a pair of multiplexed mask cells when the data field has, for example, a don't care status. The mask bits stored in a particular multiplexed mask memory cell will determine whether the left and right portions of the match line are connected to allow the match line to pass uninterrupted through the multiplexed cell.

A logic 1 mask bit stored in the left mask memory cell 118 will place a logic 1 level at the gate of T13 and a logic 0 at the gate of T14, turning T13 on and T14 off. This will allow match line 107 to pass through left mask memory cell 118 and will also disconnect the bypass line 127 from the match line left portion 125. Similarly, a logic 1 stored in the right mask memory cell 119 will place a logic 1 at the gate of T15 and a logic 0 at the gate of T16, turning T15 on and T16 off. This will allow the right portion 126 of the match line 107 to pass through the right mask memory cell 119, and will disconnect the bypass line 128 from match line right portion 126. Thus, when storing a logic 1 mask bit in either the left or right mask memory cells 118, 119, an indication is provided that an adjacent data memory cell field does not have a don't care status and should therefore not be masked.

In order to mask a particular data memory cell field within the memory word 105, one could store a logic 0 in the mask memory cells on both sides of a data memory cell field. By storing a logic 0 into the left and right mask memory cells surrounding a data memory cell field, the match line 107 is interrupted in the multiplexed mask memory cell at both ends of the data memory cell field and the bypass line that connects the right and left match line portions of the multiplexed cells at either end is connected to bypass the data memory cell field. Any of the data memory cell fields 108, 109, 110 may be programmably bypassed, or masked, as having don't care status using the multiplexed mask memory cells shown.

Figure 12B:
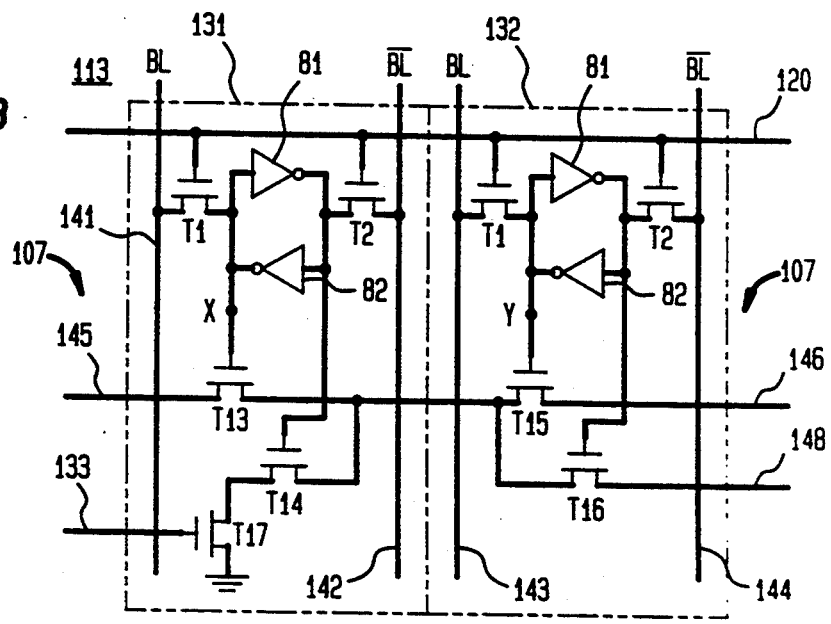
FIG. 12(b) is a schematic diagram of another exemplary multiplexed memory cell suitable for use in the CAM word of FIG. 11.

An exemplary embodiment of the left-most multiplexed mask memory cell 113 is shown in FIG. 12(b). The left-most multiplexed cell 113 has a slightly different configuration than the third multiplexer cell 115 shown in FIG. 12(a). The exemplary multiplexed cell 113 includes a left mask memory cell 131, and a right mask memory cell 132. Left mask cell 131 includes a bit line 141 and a bit line complement 142, while right mask cell 132 includes a bit line 143 and a bit line complement 144. Match line 107 within cell 113 includes a left portion 145 and a right portion 146. A right bypass line 148 may be connected to, for example, left bypass line 127 in multiplexed cell 115. The operation of the right mask memory cell 132 is the same as that of right mask memory cell 119 discussed above. Left mask memory cell 131, however, no longer includes a left bypass line, such as bypass line 127 in cell 118, because there are no other multiplexed mask memory cells to the left of multiplexed cell 113 to connect with cell 113 to bypass a data cell field. The single data cell field 108 to the left of left-most multiplexed cell 113 is bypassed by simply disconnecting left portion 145 of match line 107 via transistor T13.

In left mask cell 131, the source of T14 may be connected to ground potential via T17. T17 may be used to break a possible high-current path to ground during pre-charge of the match line 107. T17 is placed in an off state during pre-charge of match line 107, disconnecting the source of T14 from ground, by supplying a logic 0 signal to T17 gate input 133. T17 is then placed into an on state during normal CAM matching operation by placing a logic 1 signal at the gate input 133 of T17. As mentioned above, it may not be necessary to include a transistor such as T17 when other means are used to prevent excess current flow through the match line during pre-charge.

Because the multiplexed 113 is the left-most multiplexed within memory word 105, a bypass line is not carried any further to the left in the embodiment shown. The bypass line may instead be terminated to ground potential via T14 as discussed above. The first data memory cell field 108 will be bypassed, or treated as having don't care status, by simply turning off T13 in the left mask memory cell 131 to disconnect match line left portion 145 from the remainder of match line 107. The right bypass line 148 in the right mask memory cell 132 may be connected to the left bypass line 127 in left mask memory cell 118 of multiplexed cell 115 to effectively bypass, or mask, the data memory cells within data memory cell 110. The right-most multiplexed mask memory cell 114 need not include a right mask memory cell. Multiplexed cell 114 will therefore typically have only a single mask memory cell storing a single mask bit. The single mask memory cell could be, for example, the same as left mask memory cell 118 in FIG. 12(a). Since there are no additional data memory cell fields located to the right of right-most multiplexed cell 114, a right mask memory cell is not used in multiplexed cell 114.

The match line detector 112 will detect a match by sensing the signal level of the match line 107 passing through the multiplexed mask cells 113, 114, 115 and the data memory cell fields 108, 109, 110. Any field of data memory cells may be programmably masked by supplying the appropriate mask bit or bits to the appropriate multiplexed mask memory cell as described above. This embodiment of the present invention thus provides general multi-field masking. Any data memory field within a given data word may be programmably masked to permit single-step match searching of memory words in a CAM. This embodiment is particularly useful in applications in which the data word does not have a hierarchy of don't care priorities. When the data word does include an internal hierarchy of data field priorities, it may be more advantageous to use the embodiments described above in connection with FIGS. 7 and 8 in order to minimize the number of mask memory cells in the CAM.

Although the foregoing detailed description has described the present invention primarily in terms of a particular application of field masking in content-addressable memory, it should be understood that the embodiments discussed are exemplary only. Many variations may be made in the arrangements shown, including the number and size of the data fields stored within a CAM memory word, the number of mask bits used to mask a particular field or fields, and the particular implementation and interconnection of the mask memory and data memory cells. These and other alternatives and variations will be readily apparent to those skilled in the art, and the present invention is therefore limited only by the appended claims.

I claim:

1. A content-addressable memory comprising:
   a group of memory cells interconnected by a word line and a match line, each of said memory cells having a bit line for supplying an input bit to said cell, said group including a plurality of data memory cells for storing data bits of a data word, said plurality of data memory cells divided into a plurality of data memory cell fields;
   a mask memory cell within said group of memory cells and connected between two of said data memory cell fields for storing at least one mask bit indicating a status of at least one of said data memory cell fields, said mask memory cell operative to interrupt said match line in response to said mask bit; and
   a first match line detector for detecting a signal level on said match line to determine if input data bits supplied on said bit lines of said data memory cells match said data bits stored in said data memory cells of at least one of said data memory cell fields.

2. The content-addressable memory of claim 1 further including a word line driver for enabling storage of said input bits on said bit lines into said memory cells by placing an appropriate signal on said word line.

3. The content-addressable memory of claim 1 further including a plurality of said groups of memory cells for storing a plurality of said data words.

4. The content-addressable memory of claim 3 further including a plurality of said match line detectors, each of said detectors detecting a signal level on a match line interconnecting one of said groups of memory cells.

5. The content-addressable memory of claim 1 further including a second match line detector at an end of said match line opposite an end of said match line connected to said first match line detector.

6. The content-addressable memory of claim 1 wherein said plurality of data memory cells are divided into a first and a second data memory cell field.

7. The content-addressable memory of claim 6 wherein said mask memory cell is connected between said first and second data memory cell fields.

8. The content-addressable memory of claim 7 wherein said mask bit stored in said mask memory cell causes said mask memory cell to interrupt said match line interconnecting said first and second fields if said bits of said data word stored within said first data memory cell field have a don't care status.

9. The content-addressable memory of claim 1 wherein said plurality of data memory cells are divided into a first, a second and a third data memory cell field, with a first mask memory cell connected between said first and said second fields, and a second mask memory cell connected between said second and said third fields.

10. The content-addressable memory of claim 9 wherein mask bits stored in said first and second mask memory cells cause at least one of said mask memory cells to interrupt said match line interconnecting two of said data fields if said bits of said data word stored within at least one of said first and said second fields have a don't care status.

11. The content-addressable memory of claim 1 wherein said mask memory cell includes a switch for interrupting said match line in response to said mask bit stored within said mask memory cell.

12. The content-addressable memory of claim 11 wherein said switch is a MOS transistor having a gate connected to a storage element storing said mask bit.

13. The content-addressable memory of claim 11 wherein said switch includes:
   a first MOS transistor having a drain and a source connected in series with said match line, and a gate connected to a storage element storing said mask bit; and
   a second MOS transistor of opposite channel type having a drain and source connected in parallel with said drain and source of said first MOS transistor, and a gate connected to a storage element storing a complement of said mask bit.

14. The content-addressable memory of claim 11 wherein said switch includes:
   a first MOS transistor having a drain and a source connected in series with said match line and a gate connected to a storage element storing said mask bit; and
   a second MOS transistor having a drain connected to said match line and one of said source and drain of said first MOS transistor, a gate connected to a storage element storing a complement of said mask bit, and a source connected to ground potential.

15. The content-addressable memory of claim 11 wherein said switch includes:
   a first MOS transistor having a drain and a source connected in series with said match line and a gate connected to a storage element storing said mask bit; and
   a second MOS transistor having a source connected to said match line and one of said source and drain of said first transistor, a gate connected to a storage element storing a complement of said mask bit, and a drain connected to a positive voltage potential.

16. The content-addressable memory of claim 1 wherein said group of interconnected memory cells includes:
   a first data memory cell field at a word line driver end of said interconnected group;
   a second data memory cell field at a match line detector end of said group;
   a first multiplexed mask memory cell connected between said first field and said second field;
   a second multiplexed mask memory cell connected between said second field and said match line detector; and
   a bypass line connected to said match line interconnecting said multiplexed mask memory cells in said group such that said match line may bypass a data field connected between said multiplexed mask memory cells in response to at least one mask bit stored in at least one of said multiplexed mask memory cells.

17. The content-addressable memory of claim 16 wherein said group of memory cells further includes:
   at least one additional data memory cell field connected between said first multiplexed mask memory cell and said second data memory cell field; and
   an additional multiplexed mask memory cell between said additional data field and a data field adjacent thereto, said bypass line connected to said match line passing through said multiplexed mask memory cells in said group such that said match line may bypass a data field connected between said multiplexed mask memory cells in response to at least one mask bit stored in said multiplexed mask memory cells.

18. The content-addressable memory of claim 17 wherein said additional data memory cell field is a third data field connected between said first multiplexed mask memory cell and said second data field, and said additional multiplexed mask memory cell is a third multiplexed mask memory cell connected between said third data field and said second data field.

19. The content-addressable memory of claim 16 wherein said first multiplexed mask memory cell includes a left mask memory cell for storing a left mask bit and a right mask memory cell for storing a right mask bit.

20. The content-addressable memory of claim 16 wherein said second multiplexed mask memory cell includes a single mask memory cell for storing a single mask bit.

21. The content-addressable memory of claim 17 wherein said additional multiplexed mask memory cell includes a left mask memory cell for storing a left mask bit and a right mask memory cell for storing a right mask bit.

22. The content-addressable memory of claim 16 wherein said bypass line is connected between a right portion of said match line within said first multiplexed mask memory cell and a left portion of said match line within said second multiplexed mask memory cell.

23. The content-addressable memory of claim 19 wherein each of said right and said left mask memory cells in said first multiplexed mask memory cell include a switch for interrupting said match line in response to said right and left mask bits.

24. The content-addressable memory of claim 21 wherein each of said right and said left mask memory cells in said additional multiplexed mask memory cell includes a switch for interrupting said match line in response to said right and left mask bits.

25. The content-addressable memory of claim 23 wherein said switch is a MOS transistor with a drain and a source connected in series with said match line, and a gate connected to a memory storage element storing one of said right and said left mask bits.

26. The content-addressable memory of claim 1 wherein said data word is an asynchronous transfer mode packet header, and said data memory cell fields include a first data field for storing a virtual channel indicator and a second data field for storing a virtual path indicator.

27. The content-addressable memory of claim 26 wherein said mask bit stored in said mask memory cell connected between said first and second data fields indicates if said virtual channel indicator has a don't care status.

28. A method of field masking a content-addressable memory comprising the steps of:
providing a group of memory cells interconnected by a word line and a match line, each of said memory cells having a bit line for supplying an input bit to said cell;
providing a plurality of data memory cells within said group of memory cells for storing data bits of a data word, said plurality of data memory cells divided into a plurality of data memory cell fields;
providing a mask memory cell within said group of memory cells and connected between two of said data memory cell fields;
storing in said mask memory cell at least one mask bit indicating a status of at least one of said data memory cell fields, said mask memory cell operative to interrupt said match line in response to said mask bit; and
detecting a signal level on said match line to determine if input data bits supplied on said bit lines of said data memory cells match said data bits stored in said data memory cells of at least one of said data memory cell fields.

29. The method of claim 28 further including the step of providing a plurality of said groups of memory cells for storing a plurality of said data words.

30. The method of claim 28 wherein said plurality of data memory cells are divided into a first and a second data memory cell field.

31. The method of claim 30 wherein said mask memory cell is connected between said first and second data memory cell fields.

32. The method of claim 28 wherein said mask bit stored in said mask memory cell causes said mask memory cell to interrupt said match line interconnecting two of said data fields if said bits of said data word stored within one of said data memory cell fields have a don't care status.

33. The method of claim 28 further including the steps of:
providing a first data memory cell field at a word line driver end of said group;
providing a second data memory cell field at a match line detector end of said group;
providing a first multiplexed mask memory cell connected between said first field and said second field;
providing a second multiplexed mask memory cell connected between said second field and said match line detector; and
providing a bypass line connected to said match line interconnecting said multiplexed mask memory cells in said group such that said match line may bypass a data field located between said multiplexed mask memory cells in response to at least one mask bit stored in at least one of said multiplexed mask memory cells.

34. The method of claim 33 further including the steps of:
providing at least one additional data memory cell field connected between said first multiplexed mask memory cell and said second data memory cell field; and
providing an additional multiplexed-mask memory cell connected between said additional data field and a data field adjacent thereto, said bypass line connected to said match line interconnecting said multiplexed mask memory cells in said group such that said match line may bypass a data field connected between said multiplexed mask memory cells in response to at least one mask bit stored in said multiplexed mask memory cells.

35. The method of claim 28 wherein said step of providing a plurality of data memory cells for storing data bits of a data word includes providing a first data memory cell field for storing a virtual channel indicator of an asynchronous transfer mode packet header, and a second data memory cell field for storing a virtual path indicator of said header.

36. The method of claim 35 wherein said steps of providing a mask memory cell and storing at least one mask bit therein further include:

providing said mask memory cell connected between said first and said second data memory cell fields; and storing said mask bit in said mask memory cell indicating if said virtual channel indicator has a don't care status.

* * * * *